(12) United States Patent
Ohsawa et al.

(10) Patent No.: US 10,111,319 B2
(45) Date of Patent: Oct. 23, 2018

(54) CABLE CONNECTION BOARD

(71) Applicant: FUJITSU LIMITED, Kawasaki-shi, Kanagawa (JP)

(72) Inventors: Satoshi Ohsawa, Kawasaki (JP); Yasushi Masuda, Kawasaki (JP); Hiroyuki Muroi, Ota (JP)

(73) Assignee: FUJITSU LIMITED, Kawasaki (JP)

( * ) Notice: Subject to any disclaimer, the term of this patent is extended or adjusted under 35 U.S.C. 154(b) by 9 days.

(21) Appl. No.: 15/486,378

(22) Filed: Apr. 13, 2017

(65) Prior Publication Data

US 2017/0311435 A1 Oct. 26, 2017

(30) Foreign Application Priority Data

Apr. 25, 2016 (JP) ................. 2016-087330

(51) Int. Cl.
| | |
|---|---|
| *H05K 1/02* | (2006.01) |
| *H05K 1/18* | (2006.01) |
| *H01R 4/02* | (2006.01) |
| *H01R 12/53* | (2011.01) |
| *H01R 43/02* | (2006.01) |
| *H01R 12/50* | (2011.01) |
| *H01R 13/6595* | (2011.01) |
| *H01R 13/6581* | (2011.01) |
| *H01R 12/70* | (2011.01) |
| *H01R 24/50* | (2011.01) |

(52) U.S. Cl.
CPC ............. *H05K 1/025* (2013.01); *H01R 4/02* (2013.01); *H01R 12/53* (2013.01); *H05K 1/184* (2013.01); *H01R 12/707* (2013.01); *H01R 13/6581* (2013.01); *H01R 13/6595* (2013.01); *H01R 23/6893* (2013.01); *H01R 24/50* (2013.01); *H01R 43/0256* (2013.01)

(58) Field of Classification Search
CPC .......... H05K 1/025; H05K 1/184; H01R 4/02; H01R 12/53
See application file for complete search history.

(56) References Cited

U.S. PATENT DOCUMENTS

| | | | | |
|---|---|---|---|---|
| 5,046,966 A | * | 9/1991 | Snyder | ............. H01R 13/65802 439/579 |
| 5,199,879 A | * | 4/1993 | Kohn | ..................... H01R 24/58 439/63 |
| 6,541,711 B1 | * | 4/2003 | Dube | ................... H05K 1/0219 174/255 |
| 2012/0302075 A1 | | 11/2012 | Muraoka et al. | |

FOREIGN PATENT DOCUMENTS

| | | |
|---|---|---|
| JP | 63-117063 | 7/1988 |
| JP | 6-21613 | 1/1994 |
| JP | 2012-248653 | 12/2012 |

* cited by examiner

*Primary Examiner* — Ishwarbhai B Patel
(74) *Attorney, Agent, or Firm* — Fujitsu Patent Center

(57) ABSTRACT

A cable connection board includes a signal layer disposed inside a board, a first layer and a second layer disposed inside the board with the signal layer being interposed therebetween, a cable coupled to the board so as to extend to a first surface of the board, a first solder joint portion that joins an outer conductor included in the cable and the first layer to each other, and a second solder joint portion that joins a front end of an inner conductor included in the cable and the signal layer to each other in the board.

8 Claims, 6 Drawing Sheets

US 10,111,319 B2

CABLE CONNECTION BOARD

CROSS-REFERENCE TO RELATED APPLICATION

This application is based upon and claims the benefit of priority of the prior Japanese Patent Application No. 2016-087330, filed on Apr. 25, 2016, the entire contents of which are incorporated herein by reference.

FIELD

The embodiments discussed herein are related to a cable connection board.

BACKGROUND

Conventionally, because a cable may be connected to a board in which a signal wiring is mounted, various structures that connect a cable to a board have been proposed.

Incidentally, research and development for realizing high-speed transmission of, for example, 25 Gbps or more by using electrical transmission have recently been conducted. In the case where a cable is connected to a board, impedance mismatching may occur in a terminal processing unit with the cable and a connector contact at which solder joint is performed, or in the fitting portion between connectors. For example, impedance mismatching may easily occur when a stub is formed or a through-hole is formed in the board. Impedance mismatching is considered as interfering with high-speed transmission in electrical transmission. A conventional board structure is not intended for high-speed transmission, and is not suitable as a board for realizing high-speed transmission.

The followings are reference documents.
[Document 1] Japanese Laid-Open Patent Publication No. 06-021613 and
[Document 2] Japanese Laid-Open Patent Publication No. 2012-248653.

SUMMARY

According to an aspect of the invention, a cable connection board includes a signal layer disposed inside a board, a first layer and a second layer disposed inside the board with the signal layer being interposed therebetween, a cable coupled to the board so as to extend to a first surface of the board, a first solder joint portion that joins an outer conductor included in the cable and the first layer to each other, and a second solder joint portion that joins a front end of an inner conductor included in the cable and the signal layer to each other in the board.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
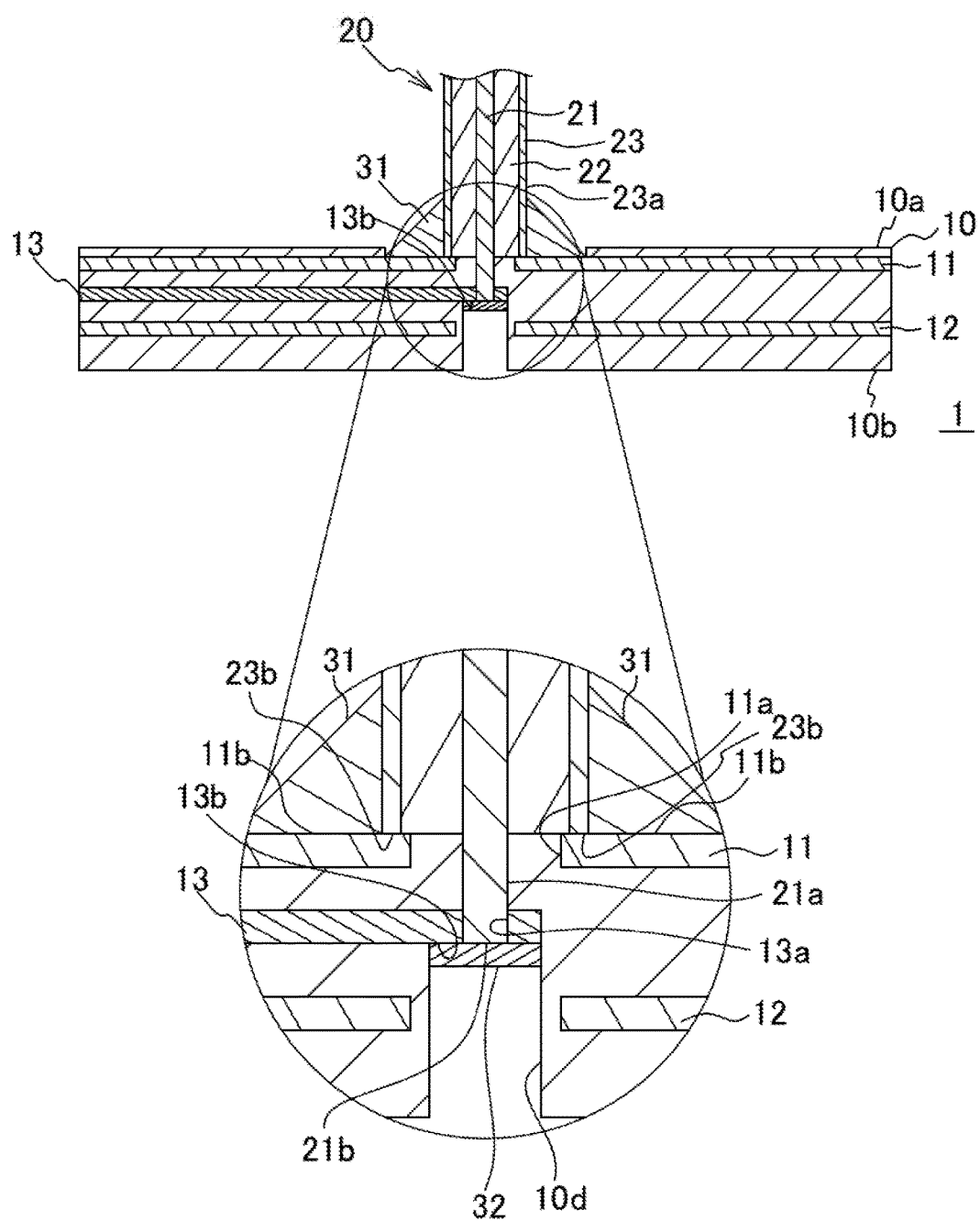
FIG. 1 is an explanatory view schematically illustrating a configuration of a cable connection board according to a first exemplary embodiment.

Hereinafter, the exemplary embodiments of the present disclosure will be described with reference to the accompanying drawings. However, in the drawings, for example, the dimensions and ratios of respective elements may not be illustrated so as to completely match the actual ones. Also, in some drawings, for the convenience of description, actually present constituent elements may be omitted, or the dimensions thereof may be exaggerated than the actual dimensions.

First Exemplary Embodiment

Figure 2:
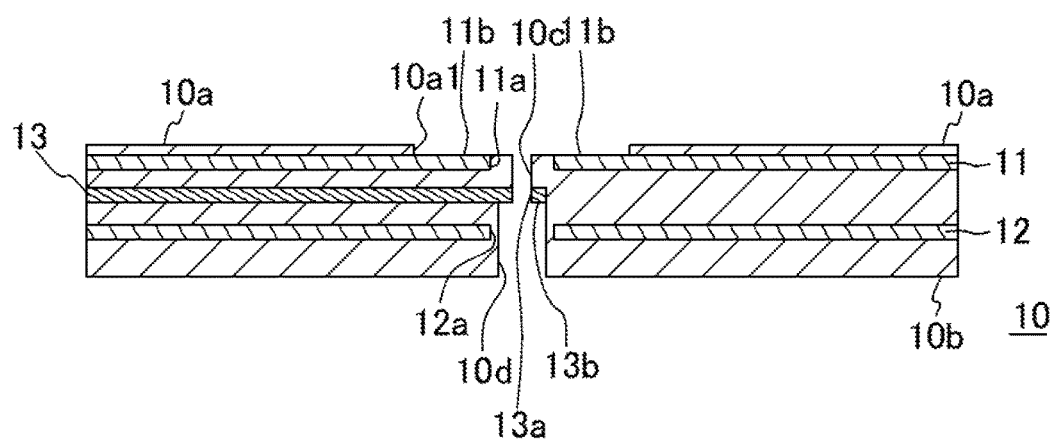
FIG. 2 is an explanatory view schematically illustrating a configuration of the board according to the first exemplary embodiment.
Figure 3A:
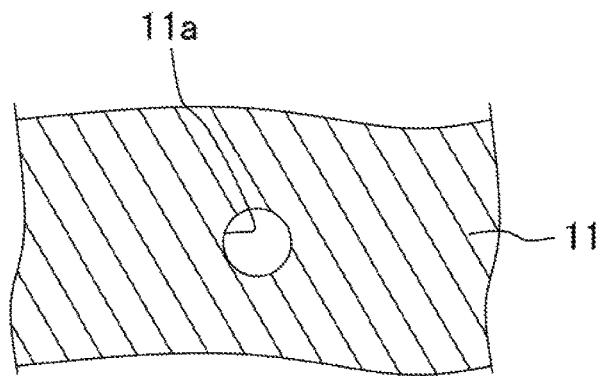
FIG. 3A is an explanatory view illustrating a main part of a first layer.
Figure 3B:
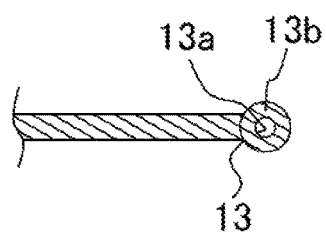
FIG. 3B is an explanatory view illustrating a main part of a signal layer.
Figure 3C:
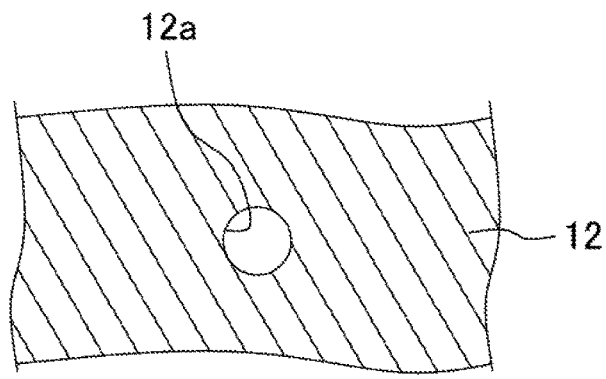
FIG. 3C is an explanatory view illustrating a main part of a second layer.
Figure 4A:
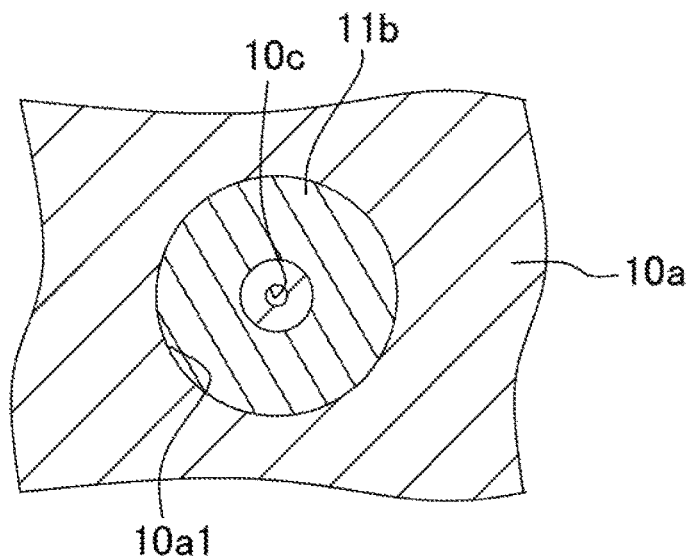
FIG. 4A is an explanatory view illustrating the periphery of a first opening formed in the first surface side of the board.
Figure 4B:
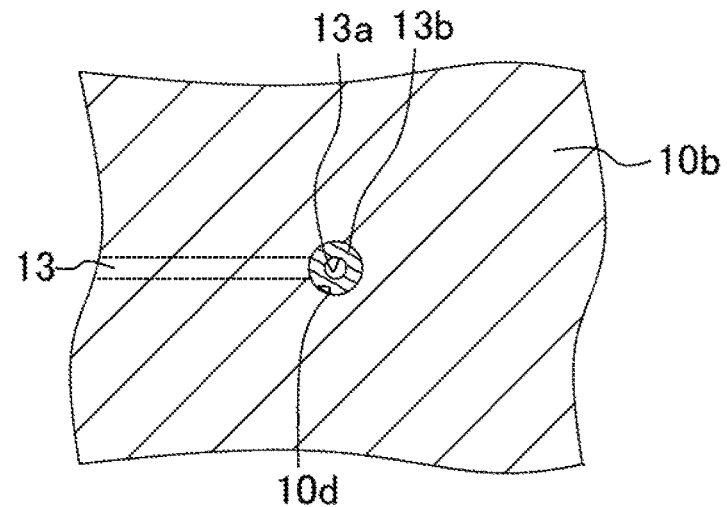
FIG. 4B is an explanatory view illustrating the periphery of a second opening formed in the second surface side of the board.
Figure 5:
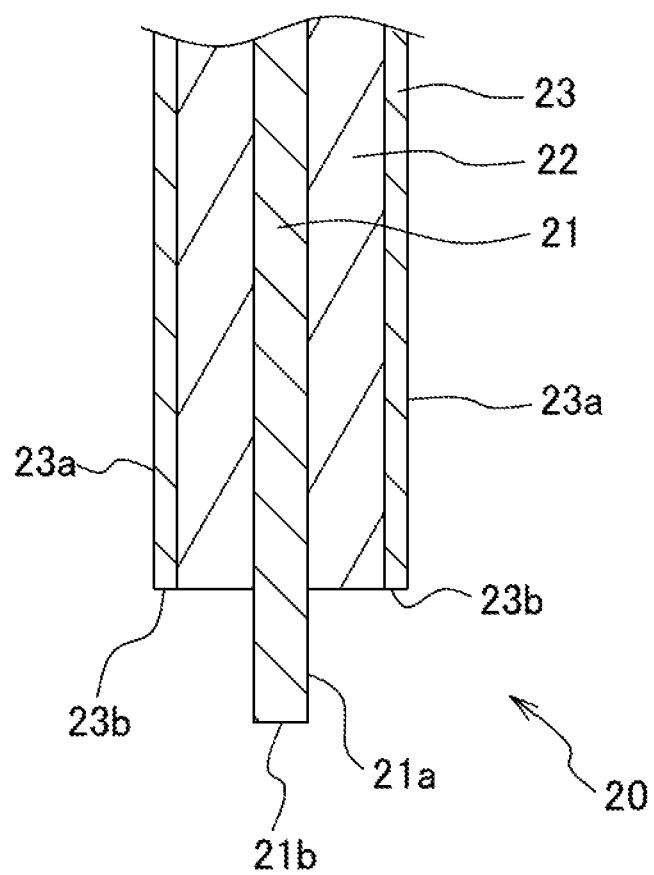
FIG. 5 is an explanatory view illustrating the front end of a cable.

A cable connection board of a first exemplary embodiment will be described with reference to FIGS. 1 to 5. FIG. 1 is an explanatory view schematically illustrating a configuration of a cable connection board according to a first exemplary embodiment. FIG. 2 is an explanatory view schematically illustrating a configuration of the board according to the first exemplary embodiment. FIG. 3A is an explanatory view illustrating a main part of a first layer, FIG. 3B is an explanatory view illustrating a main part of a signal layer, and FIG. 3C is an explanatory view illustrating a main part of a second layer. FIG. 4A is an explanatory view illustrating the periphery of a first opening formed in the first surface side of the board, and FIG. 4B is an explanatory view illustrating the periphery of a second opening formed in the second surface side of the board. FIG. 5 is an explanatory view illustrating the front end of a cable. In addition, FIG. 1 or FIG. 2 is a cross-sectional view, and respective members are hatched. Meanwhile, although FIGS. 3A to 4B are not cross-sectional views, for easy understanding of the description, respective members illustrated in FIGS. 3A to 4B are hatched in the same manner as the members illustrated in FIG. 1 or 2.

Referring to FIG. 1, the cable connection board 1 includes a board 10 and a cable 20 connected to the board 10. In the cable connection board 1 of the present exemplary embodiment, the cable 20 is connected to the board 10 in a connectorless manner. Referring to FIG. 2, the board 10 includes a first surface 10a, and a second surface 10b, which is the back surface side of the first surface 10a. Further, inside the board 10, at least a signal layer 13 is disposed, and a first layer 11 and a second layer 12 are disposed with the signal layer 13 being interposed therebetween. The first layer 11 is disposed between the signal layer 13 and the first surface 10a in the substrate 10. The second layer 12 is disposed between the signal layer 13 and the second surface 10b in the substrate 10.

Referring to FIG. 3A, the first layer 11 includes an opening 11a. Referring to FIG. 3B, the signal layer 13 includes a circular portion at the end of a band-shaped portion, and further includes a connection hole 13a in the center of the circular portion. The periphery of the connection hole 13a becomes a land 13b as will be described later in detail. Referring to FIG. 3C, the second layer 12 includes an opening 12a.

In the present exemplary embodiment, the first layer 11 is a board ground layer, and the second layer 12 is a board power layer. However, these layers are not limited to these functions, and may have other functions. For example, both the first layer 11 and the second layer 12 may be board ground layers.

Referring to FIG. 2, the first surface 10a of the board 10 is formed with a first opening 10a1. When performing resist opening on the outermost surface layer, a land 11b is exposed. The land 11b is formed around the opening 11a. The board 10 is formed with an insertion hole 10c in the center of the first opening 10a1. Referring to FIG. 4A, the land 11b is exposed inside the first opening 10a1, and the insertion hole 10c is formed inside the land 11b. The inner peripheral wall surface of the insertion hole is flush with the inner peripheral wall surface of the connection hole 13a in the signal layer 13. As will be described later in detail, an inner conductor 21 of the cable 20 is inserted into the insertion hole 10c. Accordingly, the inner conductor 21 may reach the signal layer 13.

Referring to FIG. 2, the second surface 10b of the board 10 is formed with a second opening 10d. The second opening 10d forms a space that reaches the signal layer 13 from the second surface 10b side. The diameter of the second opening 10d is smaller than that of the first opening 10a1. The second opening 10d is formed by performing a router processing from the second surface 10b side. Referring to FIG. 4B, when the second opening 10d reaches the signal layer 13, the land 13b is exposed inside the second opening 10d in the board 10 in the state where no cable 20 is connected thereto.

Referring to FIG. 5, the cable 20 is a coaxial cable. The cable 20 includes an inner conductor 21 in the center thereof and an insulator 22 around the inner conductor 21. Further, the cable 20 includes an outer conductor 23 around the insulator 22. The cable 20 is inserted from the first surface 10a side of the board 10 toward the inside of the board 10. In addition, the cable 20 is joined to the board 10 by a first solder joint portion 31, which joins the outer conductor 23 and the first layer 11 to each other, and a second solder joint portion 32, which joins the front end of the inner conductor 21 and the signal layer 13 to each other in the board 10. Accordingly, the cable 20 is connected to the board 10 in a connectorless manner, and extends to the first surface 10a side of the board 10.

Here, the first solder joint portion 31 will be described. The first solder joint portion 31 joins the first layer 11 and the outer conductor 23 to each other via a solder on the land 11b. Referring to FIG. 5, the outer conductor 23 has an outer peripheral wall surface 23a and a front end surface 23b. In addition, referring to FIG. 1, the front end surface 23b of the outer conductor 23 comes into close contact with the land 11b. A solder is received in the land 11b, which comes into contact with the front end surface 23b of the outer conductor 23, to form the first solder joint portion 31. The first solder joint portion 31 comes into close contact with the land 11b and the outer peripheral wall surface 23a of the outer conductor 23. By directly joining the outer conductor 23 to the first layer 11 as described above, impedance mismatching may be eliminated in the joint region of the outer conductor 23 and the first layer 11. In addition, because the first solder joint portion 31 fixes the periphery of the cable 20, the mounting strength of the cable 20 may be improved.

Subsequently, the second solder joint portion 32 will be described. The second solder joint portion 32 joins the front end of the inner conductor 21 and the signal layer 13 to each other in the board 10. Referring to FIG. 5, the inner conductor 21 has an outer peripheral wall surface 21a and a front end surface 21b. Here, referring to FIG. 1, the length of the portion of the inner conductor 21, which is exposed from the insulator 22, is adjusted such that the front end surface 21b is flush with the land 13b, which forms the surface on the signal layer 13 space side (the surface of the signal layer 13 located in the space) in the state where the inner conductor 21 is inserted into the connection hole 13a. This measure is taken in order to prevent formation of a stub. The second solder joint portion 32 is formed so as to cover the land 13b and the front end surface 21b. The inner conductor 21 is conducted with the signal layer 13 by coming, at the outer peripheral wall surface 21 thereof, into contact with the inner peripheral surface of the connection hole 13a and via the second solder joint portion 32. When the inner conductor 21 is directly joined to the signal layer 13, impedance mismatching in the joint region of the inner conductor 21 and the signal layer 13 may be eliminated.

As described above, according to the cable connection board 1 of the present exemplary embodiment, the characteristic impedances on the cable side and the board side may be made to coincide with each other because the cable 20 is directly joined to the first layer 11 and the signal layer 13. That is, compared to general connection between a cable and a board using a connector, a contact between a connector contact and the cable, which causes impedance mismatching, may be eliminated. In addition, when a connector is provided, a contact soldering portion is formed on the back surface side of the board. Although the contact soldering portion, which protrudes from the board surface, causes impedance mismatching, in the present exemplary embodiment, the contact soldering portion may be eliminated. At this time, the impedance mismatching may be more effectively eliminated by appropriately selecting the materials of the inner conductor 21 and the outer conductor 23 of the cable 20, the first layer 11, and the signal layer 13. When the impedance mismatching in the connection portion between the cable 20 and the board 10 is eliminated, it is advantageous for high-speed transmission.

Moreover, according to the cable connection board 1 of the present exemplary embodiment, because no connector is used and no connector mounting area is required, it is easy to deal with high-density mounting. Further, in the cable connection board 1 of the present exemplary embodiment, because the cable 20 is directly connected to the board 10, crosstalk with an adjacent signal system is suppressed. Further, according to the cable connection board 1 of the present exemplary embodiment, because the inner conductor 21 is joined to the signal layer 13 in the board 10, shielding ability against an external noise is high and electromagnetic interference (EMI) due to emitted noises is suppressed.

Second Exemplary Embodiment

Figure 6:
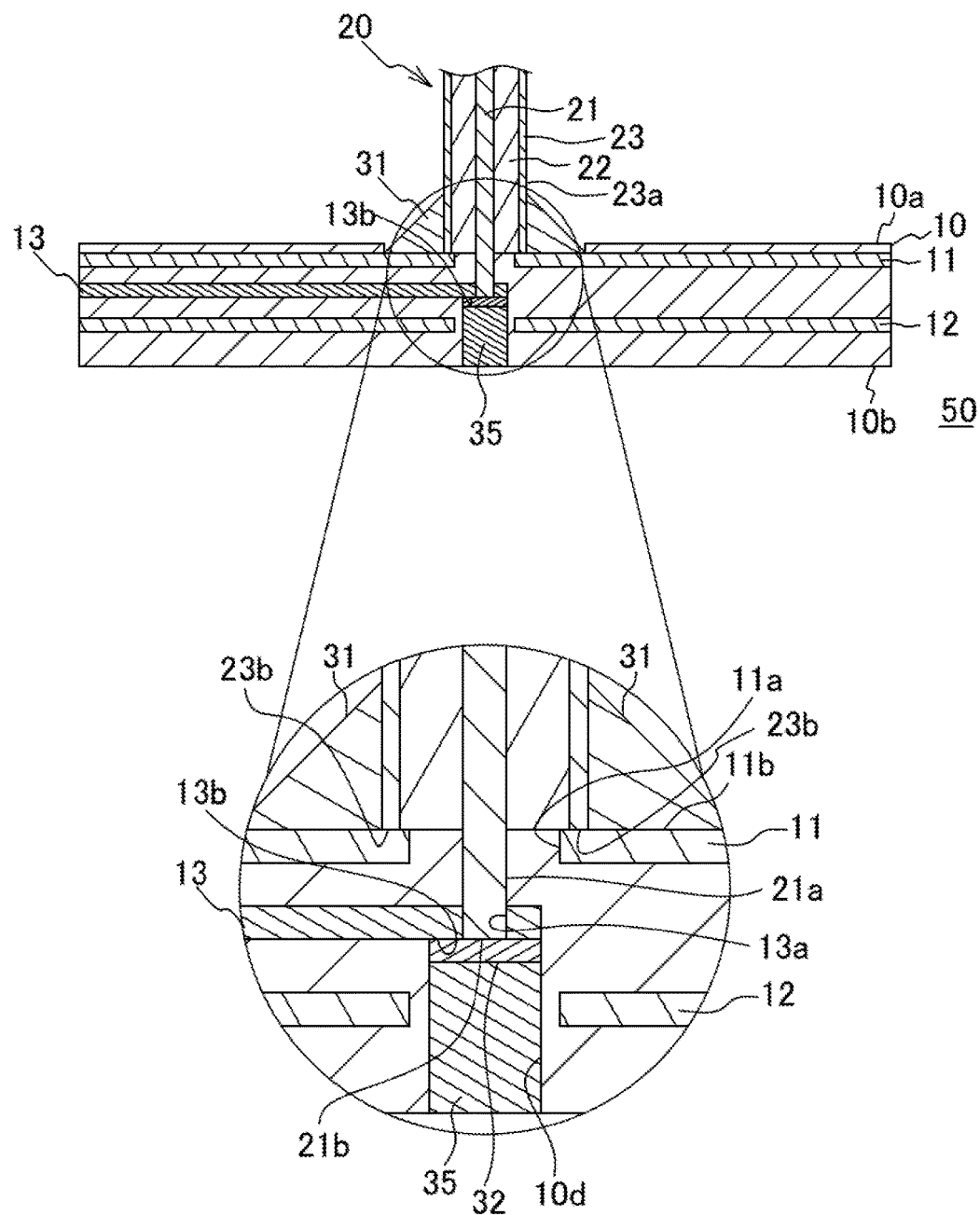
FIG. 6 is an explanatory view schematically illustrating a configuration of a cable connection board according to a second exemplary embodiment.

Subsequently, a second exemplary embodiment will be described with reference to FIG. 6. A cable connection board 50 of the second exemplary embodiment differs from the cable connection board 1 of the first exemplary embodiment in that the cable connection board 50 includes a dielectric 35. Because other configurations of the second exemplary embodiment are the same as those of the first exemplary embodiment, the common constituent elements are designated by the same reference numerals in the drawings, and a detailed description thereof will be omitted.

The dielectric 35 seals the second solder joint portion 32, which is disposed in the space formed as the second opening 10d in the second surface 10b side of the board 10. As such, by sealing the second solder joint portion 32 by the dielectric 35, it is possible to prevent the second solder joint portion 32 and the joint portion between the signal layer 13 and the inner conductor 21 from coming into contact with the atmosphere. As a result, reduction in noise may be achieved.

Here, although the dielectric 35 of the present exemplary embodiment fills the second opening 10d so as to be flush with the second surface 10b, the dielectric 35 does not have to be flush with the second surface 10b when the second solder joint portion 32 is capable of being sealed by the dielectric 35.

According to the cable connection board 50 of the second exemplary embodiment, the same effect as that of the cable connection board 1 of the first exemplary embodiment may be exerted, and reduction in noise due to the sealing of the second solder joint portion 32 may be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A cable connection board comprising:
    a signal layer disposed inside a board;
    a first layer and a second layer disposed inside the board with the signal layer being interposed therebetween;
    a cable coupled to the board so as to extend to a first surface of the board which is an opposite surface to a second surface of the board;
    a first solder joint portion that joins an outer conductor included in the cable and the first layer to each other; and
    a second solder joint portion that joins a front end surface of an inner conductor included in the cable and a lower surface of the signal layer to each other in the board,
    the board includes a space therein, which reaches the signal layer from the second surface of the board, and
    the front end surface of the inner conductor is disposed to be in a same plane with the lower surface of the signal layer on the space side.

2. The cable connection board according to claim 1, wherein the board includes a space, which reaches the signal layer from a second surface that corresponds to a back side of the first surface,
    the second solder joint portion is disposed in the space, and
    the cable connection board further comprises a dielectric disposed in the space to seal the second solder joint portion.

3. The cable connection board according to claim 1, wherein the first layer includes a land exposed in an opening formed in the first surface of the board, and the first solder joint portion joins the outer conductor and the first layer to each other on the land.

4. The cable connection board according to claim 3, wherein the outer conductor includes an outer peripheral wall surface and a front end surface, and
    the front end surface of the outer conductor comes into a close contact with the land of the first layer.

5. The cable connection board according to claim 4, wherein the first solder joint portion comes into a close contact with the land of the first layer and the outer peripheral wall surface of the outer conductor.

6. The cable connection board according to claim 1, wherein the first layer includes a land exposed in an opening formed in the first surface of the board,
    an insertion hole is formed inside the land of the first layer,
    an inner peripheral wall surface of the insertion hole is disposed to be in a same plane with an inner peripheral wall surface of a connection hole in the signal layer, and
    the inner conductor of the cable is inserted into the insertion hole.

7. The cable connection board according to claim 6, wherein the front end surface of the inner conductor is disposed to be in a same plane with a land of the signal layer which forms a surface on the space side in a state where the inner conductor is inserted into the connection hole.

8. The cable connection board according to claim 7, wherein the second solder joint portion is formed so as to cover the land of the signal layer and the front end surface of the inner conductor.

* * * * *